United States Patent [19]

Colombo

[11] 3,874,759

[45] Apr. 1, 1975

[54] ELECTRICAL CONNECTOR SOCKET FOR INTEGRATED CIRCUIT

[76] Inventor: Jospeh G. Colombo, Apt. D3, Washington Dr., Ramsey, N.J. 07446

[22] Filed: Oct. 9, 1973

[21] Appl. No.: 404,214

[52] U.S. Cl.......... 339/17 CF, 174/DIG. 3, 317/101, 339/174, 339/192

[51] Int. Cl............................................... H05k 1/02

[58] Field of Search......... 339/17, 18, 75, 174, 176, 339/192, 193, 194, 95, 99; 174/DIG.3; 317/101 CC, 101 CP

[56] References Cited

UNITED STATES PATENTS

| | | | |
|---|---|---|---|
| 2,569,550 | 10/1951 | Barton, Jr. | 339/17 D |
| 2,613,252 | 10/1952 | Heibel | 339/17 E |
| 2,951,226 | 8/1960 | Gittens | 339/17 D |
| 3,487,350 | 12/1969 | Hammell | 339/17 C |
| 3,517,376 | 6/1970 | Sarazen et al. | 339/192 R |
| 3,543,223 | 11/1970 | Krautwald et al. | 339/119 R |

FOREIGN PATENTS OR APPLICATIONS

| | | | |
|---|---|---|---|
| 884,003 | 12/1961 | United Kingdom | 339/193 R |

OTHER PUBLICATIONS

IBM Technical Disclosure Bulletin, Vol. 16 No. 4. "Deal In-Line Package Socket . . ." 09-1973, p. 1315.

*Primary Examiner*—Roy D. Frazier
*Assistant Examiner*—Terrell P. Lewis
*Attorney, Agent, or Firm*—James J. Cannon, Jr.; James J. Cannon

[57] ABSTRACT

An electrical connector socket is disclosed for mounting an integrated circuit package on a printed circuit board or wire wrap board, which circuit package consists of an integrated circuit, a housing and one or more leads extending from the housing. The socket comprises a base with one or more socket holes for receiving integrated circuit leads, an electrical contact member communicating with the socket for each lead, and at least one electrical contact pin for each lead extending from the base and positioned a substantial distance from its related socket hole. The contact pins are used to connect electrically the socket to the printed circuit board and are spaced a significant distance from their respective socket holes to provide alternative geometric as well as electrical connection points in laying out the design of the printed circuit board or wire wrap board.

3 Claims, 12 Drawing Figures

ELECTRICAL CONNECTOR SOCKET FOR INTEGRATED CIRCUIT

BACKGROUND OF THE INVENTION

1. Field of the Invention

The invention relates to electrical connector sockets for integrated circuit packages and more particularly to sockets which are to be attached to printed circuit boards or wire wrap boards.

2. Description of the Prior Art

The prior art is replete with novel and inventive designs for electrical connector sockets for attaching and connecting integrated circuit packages to printed circuit boards. For example, designs exist which hold the integrated package in a socket and make electrical contact by using a spring clip or pressure pad. Numerous terminal clip devices for securely gripping the integrated circuit lead in the socket for a firm electrical connection are also known. Many other variations too numerous to enumerate are found in literature and previously issued patents. No sockets however, are presently known to the inventor which provide an electrical terminal or contact pin for the printed circuit board purposely spaced a substantial distance from the integrated circuit lead socket hole which when used either with the lead itself protruding through the base or a second contact pin located at the socket hole provides a choice of two terminals for the purpose of simplifying art work and eliminates the need for jumper wires over the socket position.

SUMMARY OF THE INVENTION

The invention may be summarized as an electrical connector socket for integrated circuit packages for use in printed circuit boards which connector is characterized by one or more electrical contact pins afixed to the socket base positioned a substantial distance from their respective integrated circuit lead receiving socket holes. Two species are disclosed in greater detail below. The first utilizes the integrated circuit lead itself, extending through the socket hole and base as a second electrical contact pin. The second embodiment provides a second electrical contact pin directly adjacent to the socket hole as part of the socket itself.

Thus, for each integraged circuit lead, two spaced apart contact pins for making connections to the printed circuit board are ultimately provided when the integrated circuit and socket are installed on the printed circuit board. This greatly facilitates the physical laying out of a printed circuit board design since each integrated circuit lead is now accessible from at least two opposed geometric points about the socket on the board. Those skilled in the art will appreciate the time, space, and material saving advantages of the choice provided by two spaced apart socket to printed circuit contact points for each lead rather than one. By use of the invention, it is now possible in most cases, to connect two circuit terminals at separate socket locations upon the circuit board by a much straighter, simpler and more direct printed circuit line or lead than before, since it is no longer necessary to loop around or circumvent the socket position.

By simplifying the printed circuit layout design, time is saved in laying out the board, and the reliability of the end product is increased by reducing the length and complexity of the printed circuit leads.

These and other advantages of the invention will become more evident from the descrition of the preferred embodiment and drawings which follow.

DESCRIPTION OF THE PREFERRED EMBODIMENT

Figure 1:
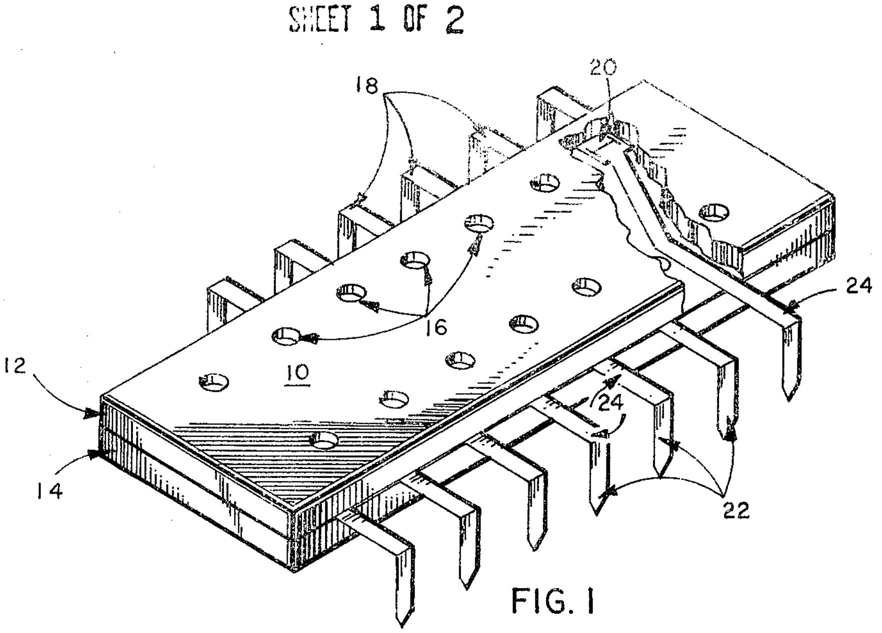
FIG. 1 is a perspective view of one form of the preferred embodiment with a portion cut away to reveal a component of the invention.
Figure 2:
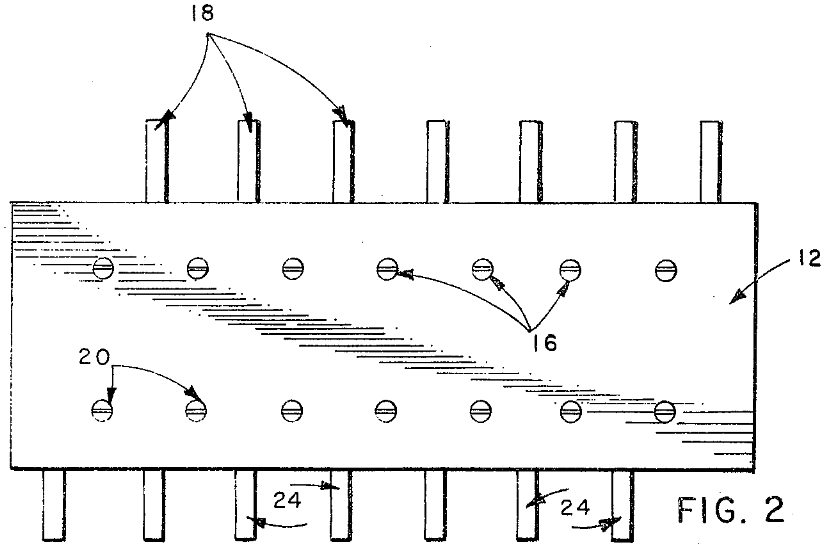
FIG. 2 is a plan view of FIG. 1.

Referring first to FIGS. 1 and 2, there is respectively shown a perspective and plan view of one form of the socket which comprises the invention. Socket 10 consists of an upper base half 12 and a lower base half 14. Integrated circuit lead receiving socket holes 16 are positioned in two rows along the longitudinal axis of the base and extend through both the upper and lower halves 12 and 14. Held between the two halves of the base as shown in cutaway view portion of FIG. 1 are electrical contact assemblies 18, one for each socket hole, consisting of an electrical contact member 20 communicating with the socket hole, electrical contact pin 22, and electrical lead 24. The assemblies may be held in place by any convenient method. For example, the two halves of the base may be inleted sufficiently to receive the body of the assembly and the two halves epoxyed or otherwise joined together.

In use, the base is fastened to the upper face of the printed circuit board by any conventional means such as clips or nuts and bolts not shown, electrical contact pins 22 extending downward through a hole in the board to provide electrical terminals for the printed circuitry contained on the under face or lower side of the board. An integrated circuit package is mounted on the socket by pressing the integrated circuit leads into the socket holes such that they extend through the base to the under face of the board a length approximately equal to that of the contact pins.

Figure 3:
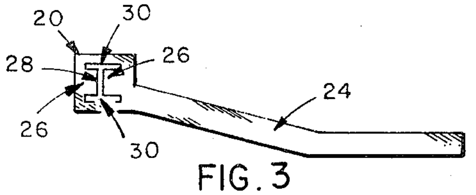
FIG. 3 is a top view of a component of the invention.
Figure 4:
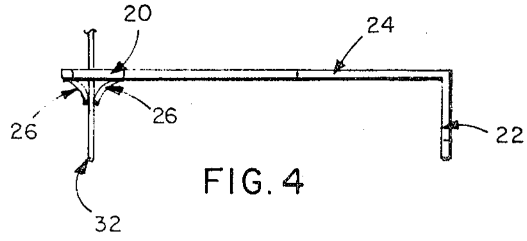
FIG. 4 is a side view of the component of FIG. 3.

As illustrated in FIG. 3, electrical contact member 20 is further composed of tabs 26 formed out of the face of contact member 20 by cutting or stamping out slots 28 and 30. Integrated circuit electrical lead 32 is slightly larger than slot 28, and upon insertion, forces the tab downward into the portion of the socket hole in the lower half of the base. The forward upper edges of the tabs grip the lead establishing electrical contact and securing the integrated circuit package as shown in FIG. 4.

Figure 5:
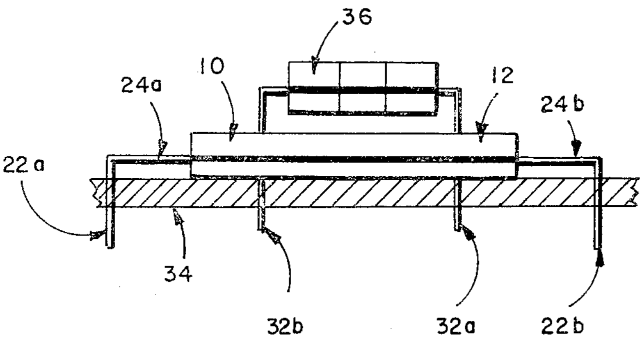
FIG. 5 is an end view of FIG. 1 with the workpiece inserted.

Referring to FIG. 5, there is shown an end view of socket 10 mounted on printed circuit board 34 with an integrated circuit package 36 inserted as described above. Contact pin 22a attached to the base by lead 24a forms a terminal a substantial distance from and opposite integrated circuit lead 32a. The lead itself forms the second terminal which as heretofore explained provides two contact positions for printed circuit leads instead of the single terminal found in prior art sockets. Thus a printed circuit lead drawn from the left of the socket may now be terminated in the vacinity of contact pin 22a instead of integrated circuit lead 32a, eliminating the necessity of looping the lead around the socket or using a jumper wire as has been required before. If the lead originated on the right of the socket, it could of course, be terminated on the right and connected directly to lead 32a.

The same is true to the electrical contact integrated circuit lead pair 22b and 32b. Depending upon the originating point of the printed circuit lead, either may be chosen as the printed circuit lead terminal without extending the lead around the socket position. The usefulness of the invention will be more appreciated upon consideration of the complexity of a printed circuit board serving as a base for a plurality of integrated circuit packages, each package having a plurality of leads. In present day technology, it is not unusual to find boards which incorporate several hundred leads. When a lead is looped around a socket position, it will ordinarily cut across the path of other leads and cause congestion in the vicinity of the socket. Only a few such loops are needed to complicate the lead path layout and require a considerable amount of trial and error layout attempts to sort the board into an optimum lead configuration. By eliminating the need to skirt the socket position, more direct paths from socket to socket may be constructed, eliminating the conditions described above and saving considerable layout time and redesign. Further, simpler layouts result in additional material savings during board manufacture since the likelihood of shorts requiring rejection of the board are commensurately reduced.

Figure 7:
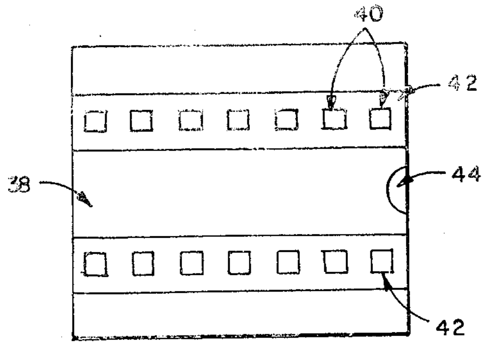
FIG. 7 is a plan view of FIG. 6.
Figure 6:
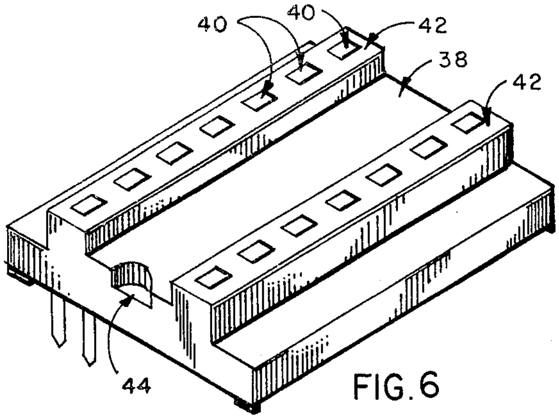
FIG. 6 is a perspective view of an additional embodiment of the invention.

Referring next to FIGS. 6 and 7, there is illustrated in perspective and plan view respectively, an additional embodiment of the socket comprising the invention. Base 38 has a plurality of integrated circuit lead receiving holes 40 arranged in two rows on step portions 42. Indentation 44 optionally provides a polarity key for inserting integrated circuit packages in the proper orientation. The purpose of the design is the same as that described above, i.e., to provide two spaced apart terminals or contact pins either of which may be designated to be connected to the circuitry of the printed circuit board at the option of the layout designer.

Figures 8, 9:
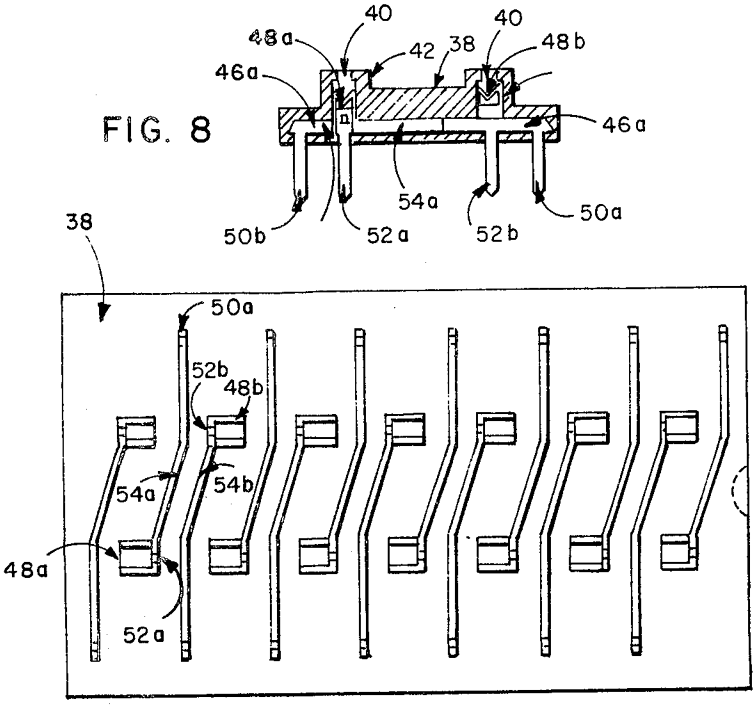
FIG. 8 is a cut away view of FIG 6.
FIG. 9 is a bottom view of FIG. 6.

FIG. 8 is a cutaway end view of FIG. 6 showing an arrangement of electrical contact assemblies 46a and 46b, each having electrical contact members 48a and 48b, first electrical contact pins 50a and 50b, second electrical contact pins 52a and 52b and connecting leads 54a and 54b.

FIG. 9 is a bottom view of the same socket illustrating further the positioning of the contact assemblies to achieve the dual spaced apart printed circuit contact pin design which as discussed above is the essence of the invention. Like numbers refer to like parts of FIG. 8.

Figures 10, 11:
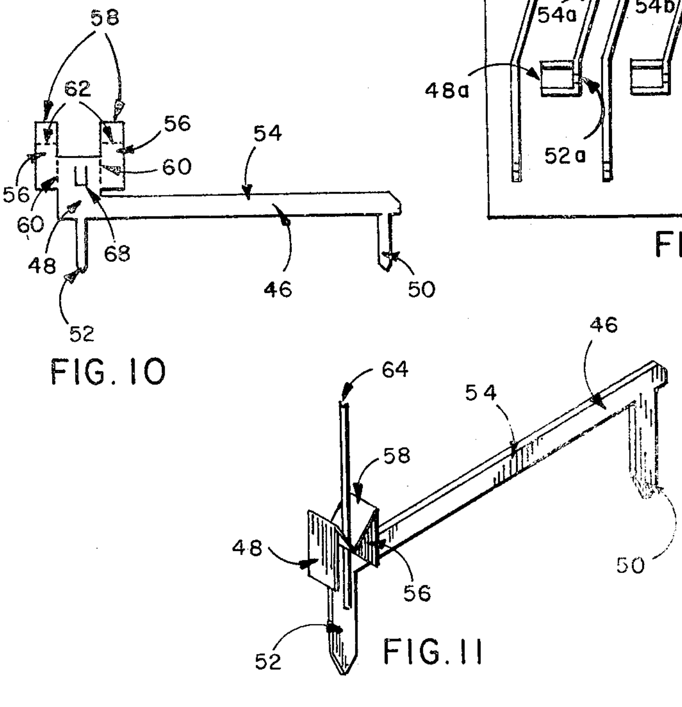
FIG. 10 is a side view of a component of the invention in the first stage of manufacture.
FIG. 11 is a perspective view of the component of FIG. 10 in the second stage of manufacture.

Referring next to FIG. 10, an electrical contact assembly is shown in the first stage of manufacture, that is, as a configuration which has been punched out of highly conductive sheet metal, preferably a beryllium copper alloy having a certain amount of spring characteristic. The parts are identified as in FIGS. 8 and 9 above.

Tabs 56 and 58 fold along dotted lines 60 and 62 as shown in FIG. 11 to form an electrical contact member for the integrated circuit lead 64. When pressed into a socket hole, the lead will spread tabs 58 which then grip the lead surface to form the connection.

Figure 12:
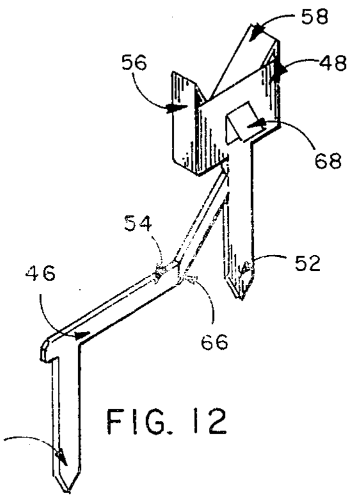
FIG. 12 is a perspective view of the component of FIG. 10 in the third stage of manufacture.

The final form of the assembly is illustrated in FIG. 12. Arm 54 has been bent at point 66 to fit the configuration shown in FIG. 9 above. Tab 68 is pressed out of the back of the contact member to provide a holding catch when the assembly is forced into receiving slots in the base.

It should be obvious to those skilled in the art that the socket of the present invention may be utilized with wire wrap boards as well as printed circuit boards. While the present specification is written in terms of microelectronic applications, it should also be obvious to those skilled in the art that the principles of the novel socket disclosed herein apply to other types of electrical sockets as well.

Many mechanical arrangements and variations of the socket and the associated electrical contact assembly may be devised for the purpose of providing two spaced apart contact pins or points as terminals for printed circuit leads. Accordingly, the invention as described above is intended to be fully defined by the following claims.

What is claimed is:

1. An integrated circuit electrical connector socket for mounting an integrated circuit package on a printed circuit board, said integrated circuit package comprising an integrated circuit, a flat rectangular housing for said circuit, and a plurality of electrical integrated circuit leads extending outwardly in a row along each of the longitudinal edges of said housing, said socket comprising in combination:

a. a flat rectangular base having a plurality of socket holes arranged in two rows along the longitudinal axis of said base, each of said socket holes for receiving one of said integrated circuit electrical leads;

b. a plurality of electrical contact members, one of each positioned within each of said socket holes for providing electrical contact with said integrated circuit electrical leads;

c. a plurality of electrical contact pins afixed to said base, one of each associated with one of each of said socket holes, each positioned opposite said associated socket hole and adjacent to the longitudinal edge of said base farthest from said socket hole for providing electrical contact with said printed circuit board; and d. a plurality of electrical leads afixed to said base, each for connecting one of said associated contact members and said contact pins.

2. The apparatus of claim 1 including a second electrical contact pin connected to each of said contact members positioned directly adjacent to each of said socket holes.

3. The apparatus of claim 1 wherein said socket holes extend through said base whereby said integrated electrical circuit leads proceed downward through said socket holes to form a second electrical contact pin.

* * * * *